(12) United States Patent
Zhu

(10) Patent No.: US 11,482,627 B2
(45) Date of Patent: *Oct. 25, 2022

(54) C-SHAPED ACTIVE AREA SEMICONDUCTOR DEVICE, METHOD OF MANUFACTURING THE SAME AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 35 days.

This patent is subject to a terminal disclaimer.

(21) Appl. No.: 17/112,831

(22) Filed: Dec. 4, 2020

(65) Prior Publication Data
US 2021/0175365 A1 Jun. 10, 2021

(30) Foreign Application Priority Data
Dec. 6, 2019 (CN) .......................... 201911254614.1

(51) Int. Cl.
*H01L 29/786* (2006.01)
*H01L 29/66* (2006.01)

(52) U.S. Cl.
CPC .. *H01L 29/78696* (2013.01); *H01L 29/66545* (2013.01); *H01L 29/66772* (2013.01); *H01L 29/78642* (2013.01)

(58) Field of Classification Search
CPC ......... H01L 29/78696; H01L 29/66484; H01L 29/66545; H01L 29/66772; H01L 29/7831; H01L 29/78642; H01L 29/0847; H01L 29/42376; H01L 29/165; H01L 29/66666; H01L 29/7848; H01L 29/7827; H01L 29/1037; H01L 29/401; H01L 29/42356
USPC ........................................................ 257/329
See application file for complete search history.

(56) References Cited

U.S. PATENT DOCUMENTS

2018/0097111 A1* 4/2018 Zhu ................ H01L 21/823807
2018/0158948 A1* 6/2018 Leobandung ....... H01L 29/0847

* cited by examiner

*Primary Examiner* — Tong-Ho Kim
(74) *Attorney, Agent, or Firm* — Haynes and Boone, LLP

(57) ABSTRACT

A C-shaped active area semiconductor device and a method of manufacturing the same and electronic device including the semiconductor device are provided. According to embodiments, the semiconductor device includes: a channel portion extending vertically on a substrate; source/drain portions located at upper and lower ends of the channel portion relative to the substrate and along the channel portion, wherein the source/drain portion extends toward a side of the channel portion in a lateral direction relative to the substrate, so that the source/drain portions and the channel portion constitute a C-shaped structure; and a gate stack that overlaps the channel portion on an inner sidewall of the C-shaped structure, wherein the gate stack has a portion surrounded by the C-shaped structure.

34 Claims, 21 Drawing Sheets

C-SHAPED ACTIVE AREA SEMICONDUCTOR DEVICE, METHOD OF MANUFACTURING THE SAME AND ELECTRONIC DEVICE INCLUDING THE SAME

CROSS-REFERENCE TO RELATED APPLICATION

This application claims the benefit of Chinese Patent Application No. 201911254614.1 filed on Dec. 6, 2019, the whole disclosure of which is incorporated herein by reference.

TECHNICAL FIELD

The present disclosure relates to the field of semiconductor technology, in particular to a semiconductor device with a C-shaped active area and a method of manufacturing the same and electronic device including the semiconductor device.

BACKGROUND

With the continuous miniaturization of semiconductor devices, devices with various structures such as fin field effect transistors (FinFET), multi-bridge channel field effect transistors (MBCFET) and so on have been proposed. However, these devices still cannot meet the requirements due to the limitation of device structure in terms of increasing integration density and enhancing device performance.

SUMMARY

In view of this, the purpose of the present disclosure is at least partly to provide a semiconductor device with a C-shaped active area, a method of manufacturing the same, and an electronic device including the semiconductor device.

According to one aspect of the present disclosure, a semiconductor device is provided, it comprises: a channel portion extending vertically on a substrate; source/drain portions located at upper and lower ends of the channel portion relative to the substrate and along the channel portion, wherein the source/drain portions extend toward a side of the channel portion in a lateral direction relative to the substrate, so that the source/drain portions and the channel portion constitute a C-shaped structure; and a gate stack that overlaps the channel portion on an inner sidewall of the C-shaped structure, wherein the gate stack has a portion surrounded by the C-shaped structure.

According to another aspect of the present disclosure, a method of manufacturing a semiconductor device is provided, it comprises: providing a stack of a first material layer, a second material layer and a third material layer on a substrate; patterning the stack into a strip shape extending in a first direction; forming a first active layer on a sidewall of the stack patterned in a strip shape; forming a strip-shaped opening extending in the first direction in the stack patterned in the strip shape, thereby dividing the stack into two parts on opposite sides of the opening; replacing the second material layer with a dummy gate through the opening; forming source/drain portions in the first material layer and the third material layer; removing the dummy gate through the opening; and forming a gate stack, the gate stack having a portion embedded in a space left due to the removal of the dummy gate.

According to another aspect of the present disclosure, an electronic device is provided, it comprises the aforementioned semiconductor device.

According to the embodiments of the present disclosure, a semiconductor device with a novel structure is proposed, which may have the advantages of high performance and high density.

BRIEF DESCRIPTION OF THE DRAWINGS

Through the following description of the embodiments of the present disclosure with reference to the accompanying drawings, the above and other objectives, features, and advantages of the present disclosure will be more apparent. In the accompanying drawings:

FIGS. 1 to 21(c) schematically show some stages in the process of manufacturing a semiconductor device according to some embodiments of the present disclosure, wherein, FIGS. 3(a), 4(a), 5(a), 8(a), 15(a), 16(a), 17, 18(a), 21(a) are top views, FIGS. 1, 2, 3(b), 9(a), 12(a), 14(a), 15(b) are cross-sectional views taken along AA' line, FIGS. 3(c), 4(b), 5(b), 6, 7, 8(b), 9(b), 10, 11, 12(b), 13(a), 13(b), 14(b), 15(c), 16(b), 18(b), 19(a), 20(a), 21(b) are cross-sectional views taken along BB' line, FIGS. 15(d), 16(c), 18(c), 19(b), 20(b), 21(c) are cross-sectional views taken along CC' line.

Throughout the drawings, the same or similar reference signs indicate the same or similar parts

DETAILED DESCRIPTION OF EMBODIMENTS

Figure 1:
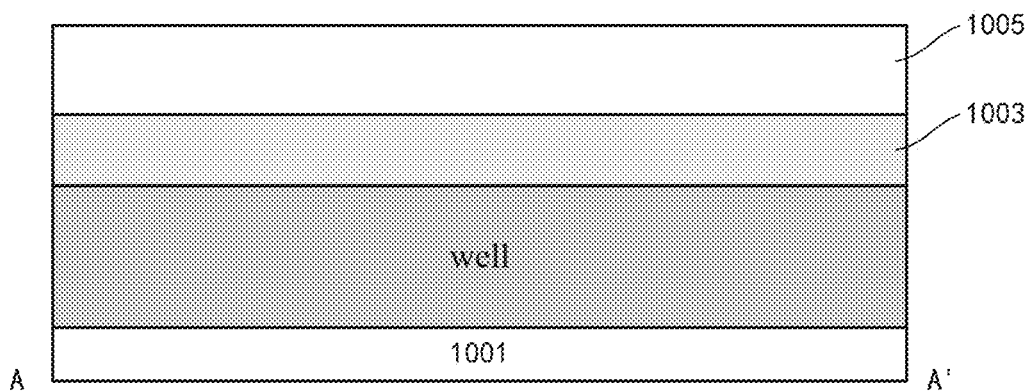

Hereinafter, embodiments of the present disclosure will be described with reference to the drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

Various structural schematic diagrams according to embodiments of the present disclosure are shown in the drawings. The drawings are not drawn to scale, some details are enlarged and some details may be omitted for clarity of presentation. The shapes of the various areas and layers and relative size and positional relationship therebetween shown in the drawings are only exemplary. In practice, there may be deviations due to manufacturing tolerances or technical limitations. Those skilled in the art may additionally design areas/layers with different shapes, sizes, and relative positions according to actual needs.

In the context of the present disclosure, when a layer/device is referred to as being "on" the another layer/device, the layer/device may be directly on another layer/device, or there may be intervening layer/device. In addition, if a layer/device is located "on" another layer/device in one orientation, the layer/device may be located "under" the another layer/device when the orientation is reversed.

According to some embodiments of the present disclosure, a vertical type semiconductor device is provided, it has an active area arranged vertically on a substrate (for example, in a direction substantially perpendicular to the surface of the substrate). The channel portion may be a vertical nanosheet, so this device may be called a vertical nano-sheet FET (VNFET). Compared with nanosheet devices in which nanosheets are arranged laterally with respect to the substrate, the VNFET may save area. As described below, the nanosheet may be formed by epitaxial growth, so it may be a single piece, and may have a substantially uniform thickness. According to some embodiments, the nanosheet may have a line shape extending in the first direction in a plan view.

The semiconductor device may further include source/drain portions respectively provided at the upper and lower ends of the channel portion. The source/drain portions may be provided along the channel portion. According to some embodiments, the source/drain portion may protrude toward a side of the channel portion in a lateral direction with respect to the substrate (for example, a second direction intersecting, such as perpendicular to, the first direction), so that the source/drain portions and the channel portion may form a C-shaped structure. The C-shaped structure may help define a space for accommodating the gate stack.

The source/drain portion may have a certain doping. For example, for a p-type device, the source/drain portion may have p-type doping; for an n-type device, the source/drain portion may have n-type doping. The doping profile of the source/drain portion may have an end portion that overlaps the gate stack to reduce external resistance. The channel portion may have a certain doping to adjust the threshold voltage of the device. Alternatively, the semiconductor device may be a junctionless device, in which the channel portion and the source/drain portions may have the same conductivity type doping. Alternatively, the semiconductor device may be a tunneling type device, in which the source/drain portions at both ends of the channel portion may have doping types opposite to each other.

The channel portion may include a single crystal semiconductor material. Of course, the source/drain portion may also include a single crystal semiconductor material. For example, they may all be formed by epitaxial growth.

The active area of the device may be between the isolation layers in the first direction. The gate conductivity in the gate stack may extend from the area where the C-shaped structure is located to the area where the isolation layer is located, and may have a relatively increased area in the area where the isolation layer is located, so as to form landing pads for the gate contact portion.

Such a semiconductor device may be manufactured as follows, for example.

According to some embodiments, a stack of a first material layer, a second material layer, and a third material layer may be provided on the substrate. The first material layer may define the position of the lower source/drain portion, the second material layer may define the position of the gate stack, and the third material layer may define the position of the upper source/drain portion. The first material layer may be provided by a substrate, such as the upper portion of the substrate. Alternatively, the first material layer, the second material layer, and the third material layer may be sequentially formed on the substrate by, for example, epitaxial growth. If the first material layer and the third material layer are directly used as source/drain portions below, they may be doped in situ while being grown epitaxially.

The stack may be patterned into a strip shape extending in the first direction. The first active layer may be formed on opposite sidewalls of the strip-shaped stack in the second direction intersecting (for example, perpendicular to) the first direction. The first active layer may define the channel portion. One device may be formed based on the first active layer on each opposite sidewall. Thus, based on a single strip-shaped stack, two devices opposite to each other may be formed.

The gate stack may be formed between the opposed first active layers. To this end, an opening may be formed in the strip-shaped stack to leave a space between the opposed first active layers. The opening may also extend substantially in the first direction, so that the above-mentioned stack is divided into two substantially identical parts. This facilitates the formation of source/drain portions along the channel portion. The second material layer may be replaced with a gate stack through the opening.

In order to facilitate the formation of the source/drain portion, for example, the source/drain portion is formed by doping the first material layer and the third material layer (especially in the case that they are not doped when they are formed), or a second active layer is grown as described below to form the source/drain portion, and a dummy gate may be formed first. For example, the second material layer may be removed by selective etching through the above-mentioned opening, thus leaving a space between the first material layer and the second material layer. The dummy gate may be formed in this space. The dummy gate covers a part of the first active layer between the first material layer and the second material layer.

Source/drain portions may be formed on the upper and lower sides of the dummy gate. For example, the source/drain portions may be formed by doping the first material layer and the third material layer. This doping may be achieved by a solid phase dopant source layer. Alternatively, the first material layer and the third material layer may be at least partially removed (or even completely removed, thereby exposing the first active layer), and the second active layer may be grown on the upper and lower sides of the dummy gate. The second active layer may be doped in situ during growth. The impurities may be activated by annealing, so that the impurities may diffuse into the first active layer and may overlap with the end portion of the dummy gate to a certain extent.

After that, the dummy gate may be replaced with a gate stack by a gate replacement process.

The present disclosure may be presented in various forms, some examples of which will be described below. In the following description, the selection of various materials is involved. For the selection of materials, In addition to considering their functions (for example, semiconductor materials are used to form active areas and dielectric materials are used to form electrical isolation), etching selectivity is also considered. In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity relative to other layers exposed to the same etching recipe.

FIGS. 1 to 21(*c*) schematically illustrate some stages in the process of manufacturing a semiconductor device according to some embodiments of the present disclosure.

As shown in FIG. 1, a substrate 1001 is provided (the above-mentioned first material layer may be formed on the upper portion thereof). The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, and the like. In the following description, for convenience of description, a bulk Si substrate is taken as an example for description. Herein, a silicon wafer is provided as the substrate 1001.

In the substrate 1001, a well region may be formed. If a p-type device is to be formed, the well region may be an n-type well; if an n-type device is to be formed, the well region may be a p-type well. The well region may be formed, for example, by implanting corresponding conductivity type dopants (p-type dopants such as B or In, or n-type dopants such as As or P) into the substrate 1001 and then performing thermal annealing. There are many ways to set up such well regions in the art, which will not be repeated here.

On the substrate 1001, a second material layer 1003 and a third material layer 1005 may be formed by, for example, epitaxial growth. The second material layer 1003 may be used to define the position of the gate stack, and the thickness is, for example, about 20 nm-50 nm. The third material layer 1005 may be used to define the position of the upper source/drain portion, and the thickness is, for example, about 20 nm-200 nm.

The substrate 1001 and adjacent layers among the above-mentioned layers formed thereon may have etching selectivity with respect to each other. For example, in a case where the substrate 1001 is a silicon wafer, the second material layer 1003 may include SiGe (for example, the atomic percentage of Ge is about 10%-30%), and the third material layer 1005 may include Si.

Figure 2:
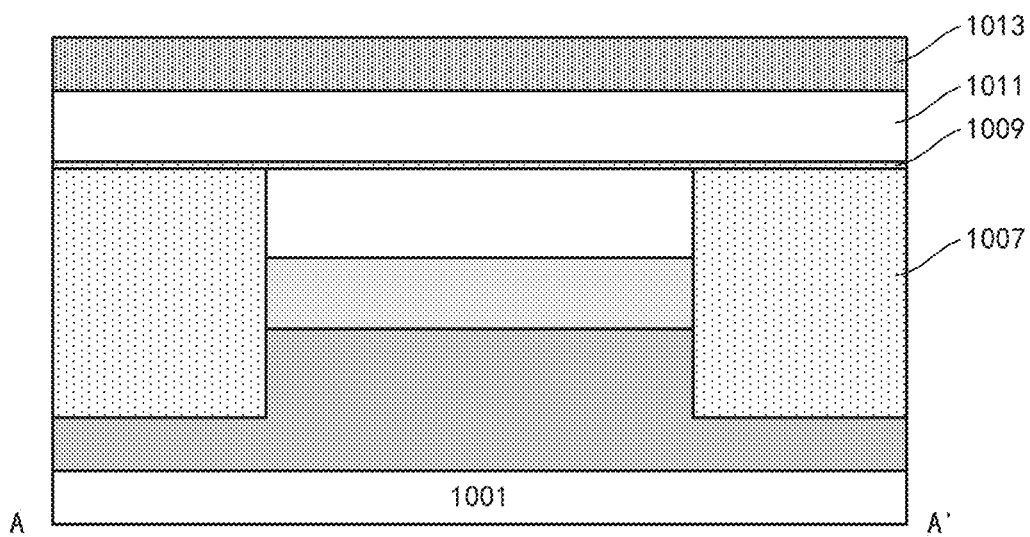

As shown in FIG. 2, in the substrate 1001, an active area may be defined by an isolation portion 1007, such as shallow trench isolation (STI). For example, the isolation portion 1007 may surround each active area. Herein, the isolation portion 1007 may pass through the second material layer 1003 and the third material layer 1005.

According to the embodiment, a spacer pattern transfer technology is used in the following patterning. To form the spacer, a mandrel may be formed. Specifically, a layer 1011 for a mandrel pattern may be formed on the third material layer 1005 by, for example, deposition. For example, the layer 1011 used for the mandrel pattern may include amorphous silicon or polysilicon, with a thickness of about 50 nm-150 nm. In addition, for better etching control, an etching stop layer 1009 may be formed first by, for example, deposition. For example, the etching stop layer 1009 may include oxide (for example, silicon oxide) with a thickness of about 2 nm-10 nm.

On the layer 1011 for the mandrel pattern, a hard mask layer 1013 may be formed by, for example, deposition. For example, the hard mask layer 1013 may include nitride (for example, silicon nitride) with a thickness of about 50 nm-100 nm.

The layer 1011 for the mandrel pattern may be patterned into a mandrel pattern.

Figure 3A:
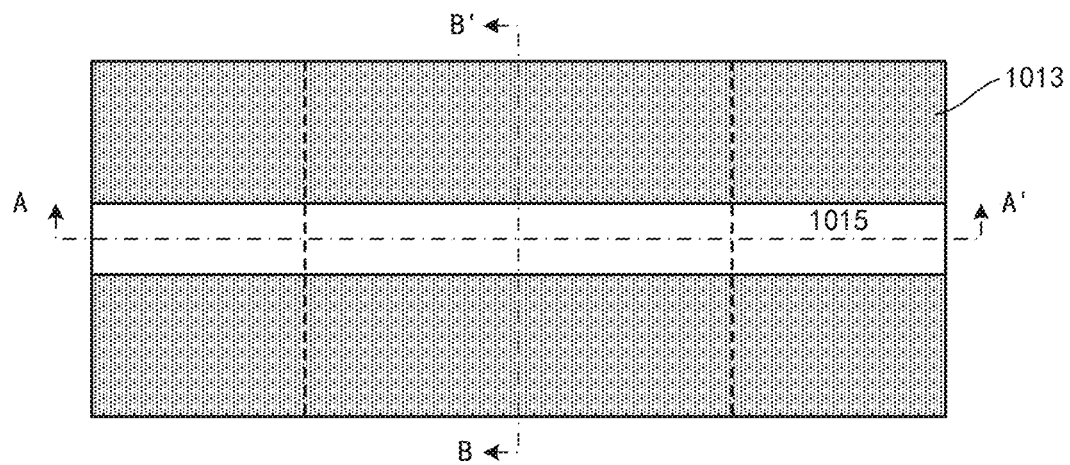
Figure 3B:
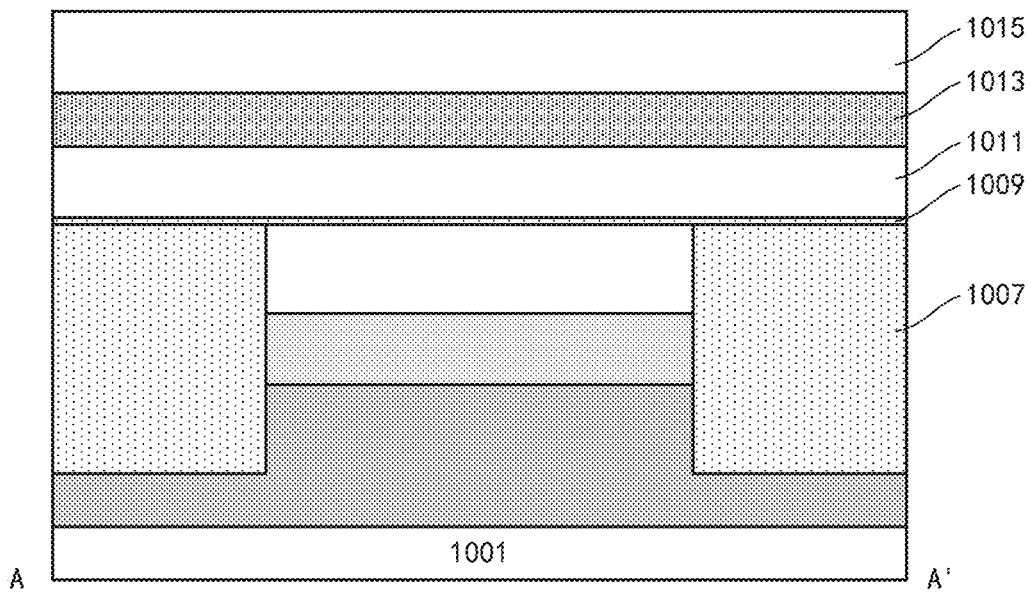
Figure 3C:
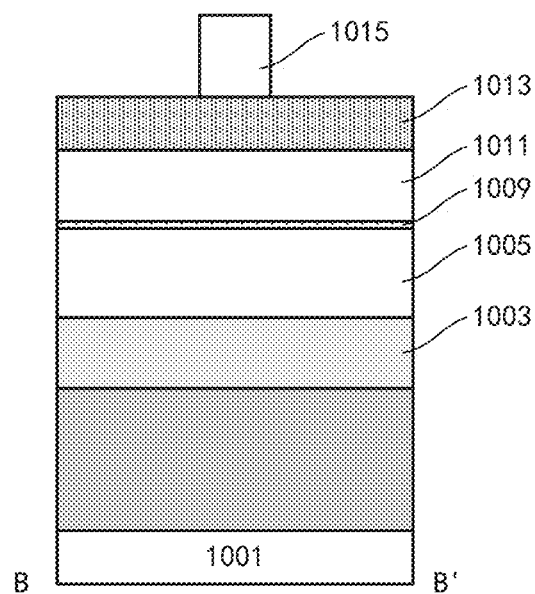

For example, as shown in FIGS. 3(a) to 3(c), a photoresist 1015 may be formed on the hard mask layer 1013 and patterned to a strip extending in the first direction (the horizontal direction on the principal plane in FIG. 3(a)) by photolithography. Herein, the stripe pattern is shown as extending onto the isolation portion 1007.

Figure 4A:
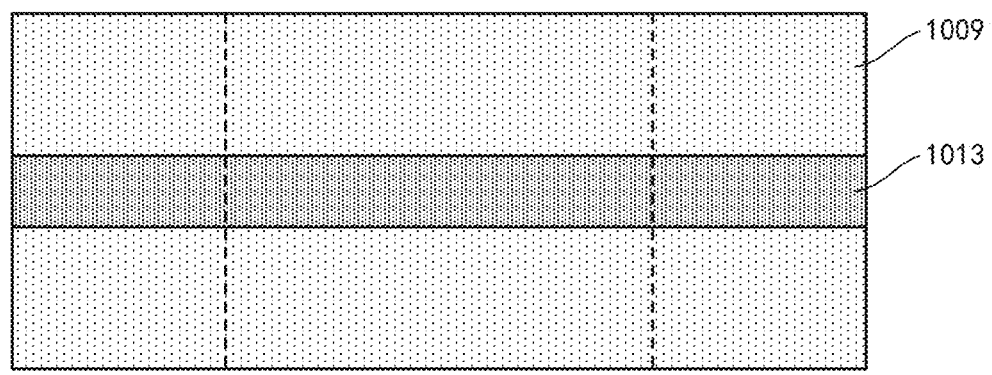
Figure 4B:
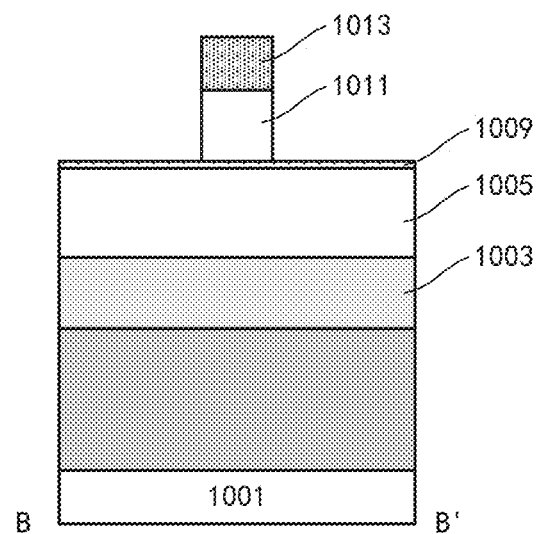

As shown in FIGS. 4(a) and 4(b), the photoresist 1015 may be used as an etching mask, and the hard mask layer 1013 and the layer 1011 for the mandrel pattern are sequentially selectively etched by, for example, reactive ion etching (RIE) to transfer the photoresist pattern to the hard mask layer 1013 and the layer 1011 for the mandrel pattern. The etching may stop at the etching stop layer 1009. After that, the photoresist 1015 may be removed.

Figure 5A:
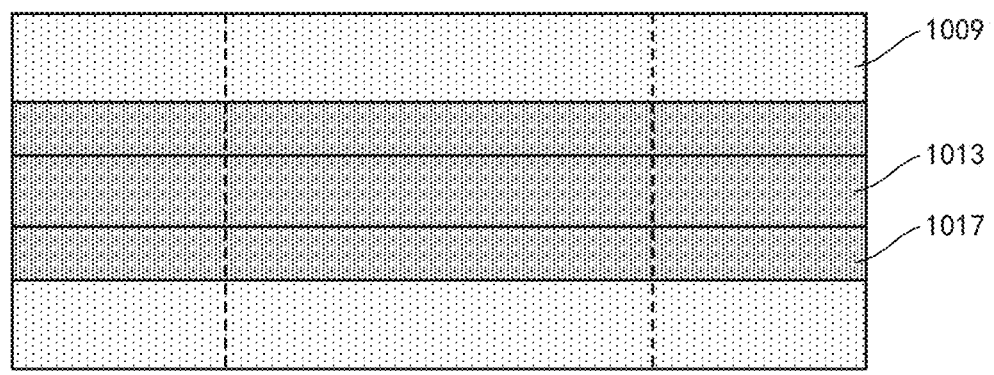
Figure 5B:
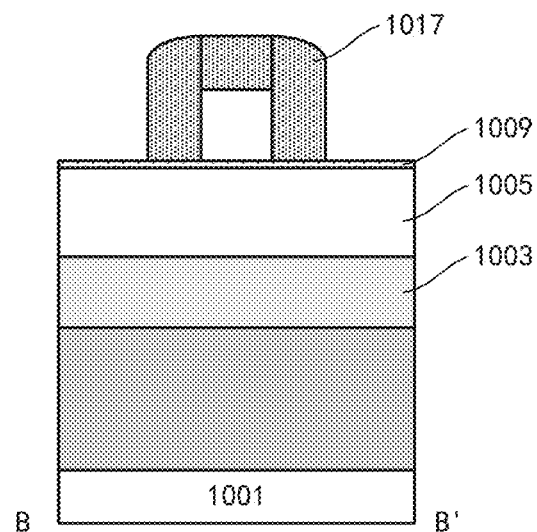

As shown in FIGS. 5(a) and 5(b), a spacer 1017 is formed on the side walls on opposite sides of the mandrel pattern 1011 in the second direction (the vertical direction on the principal plane in FIG. 5(a)) intersecting (for example, perpendicular to) the first direction. For example, a nitride layer with a thickness of about 20 nm-50 nm may be deposited in a substantially conformal manner, and then the deposited nitride layer may be anisotropically etched such as RIE in the vertical direction (it may be stopped at the etching stop layer 1009) to remove its horizontal extending portion and leave its vertical extending portion, thereby obtaining the spacer 1017. The spacer 1017 may then be used to define the location of the active area of the device.

Figure 6:
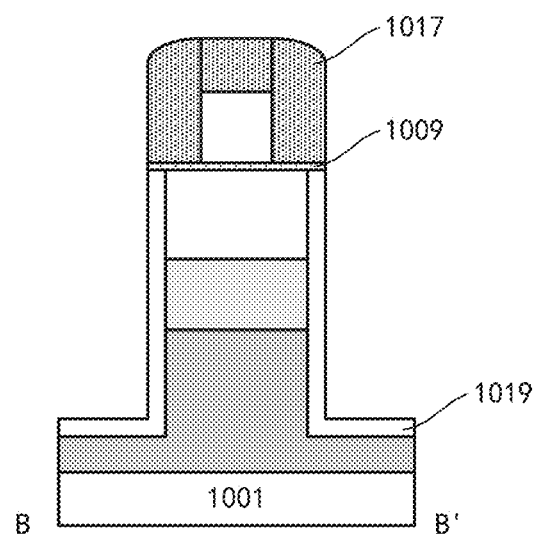

As shown in FIG. 6, the hard mask layer 1013 and the spacer 1017 may be used to pattern the third material layer 1005, the second material layer 1003 and the upper portion (first material layer) of the substrate 1001 into a ridge structure. For example, the hard mask layer 1013 and the spacer 1017 may be used as an etching mask, and each layer is selectively etched sequentially by, for example, RIE, to transfer the pattern to the lower layers. The etching may enter the well region of the substrate 1001. Thus, between the isolation portions 1007, the upper portion of the substrate 1001, the second material layer 1003 and the third material layer 1005 may form a stripe-shaped ridge structure extending in the first direction.

The first active layer may be formed on the sidewall of the ridge structure so as to subsequently define the channel portion. For the convenience of the following patterning, the part of the first active layer serving as the channel portion may be formed under the spacer 1017 (It is possible to minimize the protective layer for the channel part in the follow patterning). For example, the ridge structure may be etched back so that its outer peripheral side wall is recessed laterally with respect to the outer peripheral side wall of the spacer 1017. To control the etching depth, atomic layer etching (ALE) may be used. Then, the first active layer 1019 may be formed on the sidewall of the ridge structure by, for example, selective epitaxial growth. Due to the selective epitaxial growth, the first active layer 1019 may be formed on the vertical sidewall of the ridge structure and the surface of the substrate 1001. The first active layer 1019 may then define the channel portion, and has a thickness of, for example, about 3 nm-15 nm. According to some embodiments of the present disclosure, the thickness of the first active layer 1019 (which is then used as a channel portion) may be determined by an epitaxial growth process, and thus the thickness of the channel portion may be better controlled.

On opposite sides of the ridge structure, the first active layer 1019 may be formed in an L shape extending along the corresponding sidewall under the spacer 1017, respectively.

In FIG. 6, the sidewalls of the part of the first active layer 1019 on the vertical sidewalls of the ridge structure are shown to be substantially flush with the sidewalls of the spacer 1017. This may be achieved by controlling the amount of etch-back and the epitaxial growth thickness to be substantially the same. However, the present disclosure is not limited to this. For example, the sidewall of the part of the first active layer 1019 on the vertical sidewall of the ridge structure may be recessed relative to the sidewall of the spacer 1017, or may even protrude.

Due to this epitaxial growth, the material of the first active layer 1019 may be appropriately selected according to the performance requirements of the device in the design. For example, the first active layer 1019 may include various semiconductor materials, such as Si, Ge, SiGe, GaAs, InGaAs, and so on.

In the example of FIG. 6, the first active layers 1019 on opposite sides of the isolation portion 1007 may have substantially the same characteristics (for example, material, size, etc.). However, the present disclosure is not limited to this. As described below, through a single ridge structure, two devices facing each other may be formed. According to the performance requirements of the two devices in the design, the first active layers 1019 on the opposite sides of the ridge structure may have different characteristics, such as different thicknesses and/or materials. This may be achieved by shielding another device area when the first active layer is grown in one device area.

Figure 7:
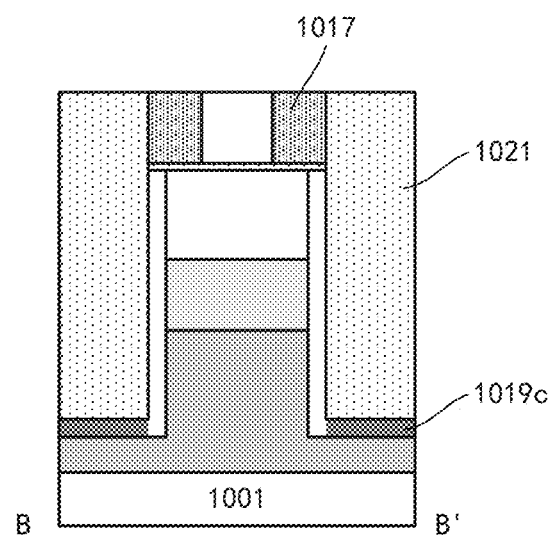

In order to facilitate manufacturing the electrical contact to the source/drain portion located at the lower end subsequently, a contact area may be formed in the laterally extending portion of the first active layer 1019. For example, dopants may be implanted into the laterally extending portion of the first active layer 1019 through ion implantation. The conductivity type of the dopants may be the same as the conductivity type of the lower end contact portion formed later. For example, for p-type devices, p-type dopants such as B, $BF_2$ or In may be implanted with a concentration of about 1E19-1E21 $cm^{-3}$; for n-type devices, n-type dopants such as P or As may be implanted with a concentration of about 1E19-1E21 $cm^{-3}$. The laterally extending portion of the first active layer 1019 containing the dopants (which may be activated by a subsequent annealing process) may form a contact area 1019c, as shown in FIG. 7. Due to the existence of the spacer 1017, ion implantation may not substantially affect the vertical portion of the first active layer 1019 (which forms the channel portion subsequently).

In order to further reduce the contact resistance, silicide may also be formed on the laterally extending portion of the first active layer 1019. For example, a shielding layer (for example, oxynitride in the form of a spacer) may be used to shield the vertically extending portion of the first active layer 1019, then a metal such as NiPt, Co, Ni, Ti, etc. is deposited on the laterally extending portion of the first active layer 1019, and an annealing process is performed to make the metal react with the laterally extending portion of the first active layer 1019, thereby generating silicide. After that, unreacted metal may be removed, and the shielding layer may be removed.

As shown in FIG. 7, the isolation layer 1021 may be formed around the ridge structure which is provided with the first active layer 1019 formed on the sidewall. For example, an oxide layer that completely covers the ridge structure may be formed on the substrate 1001 by deposition, and the deposited oxide layer may be planarized, such as chemical mechanical polishing (CMP) (CMP may stop at the mandrel pattern 1011) to form the isolation layer 1021. The isolation layer 1021 and the previous isolation layer 1007 surround the outer circumference of the ridge structure.

Figure 8A:
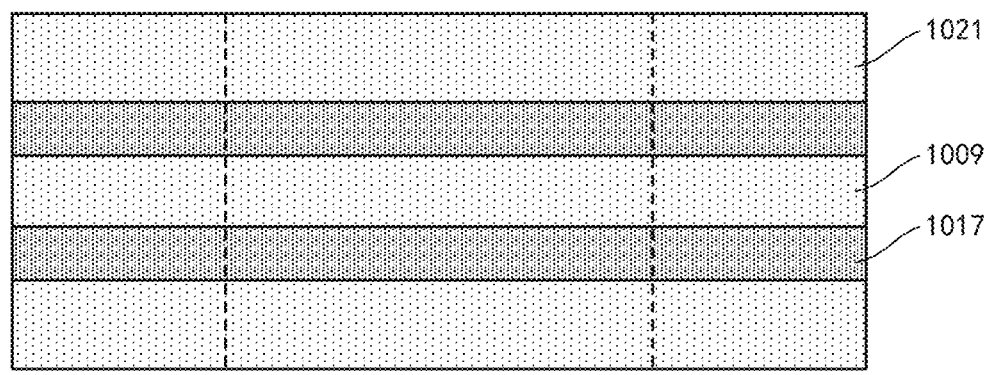
Figure 8B:
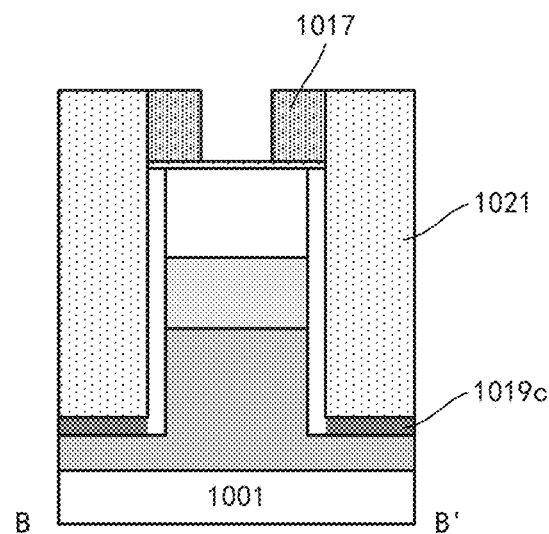

As shown in FIGS. 8(a) and 8(b), the mandrel pattern 1011 may be removed by selective etching such as wet etching using TMAH solution or dry etching using RIE. In this way, a pair of spacers 1017 extending opposite to each other are left on the ridge structure.

Figure 9A:
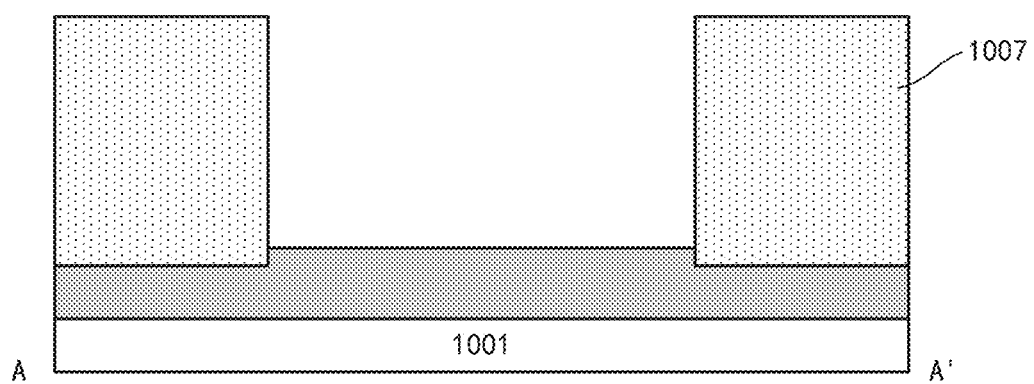
Figure 9:
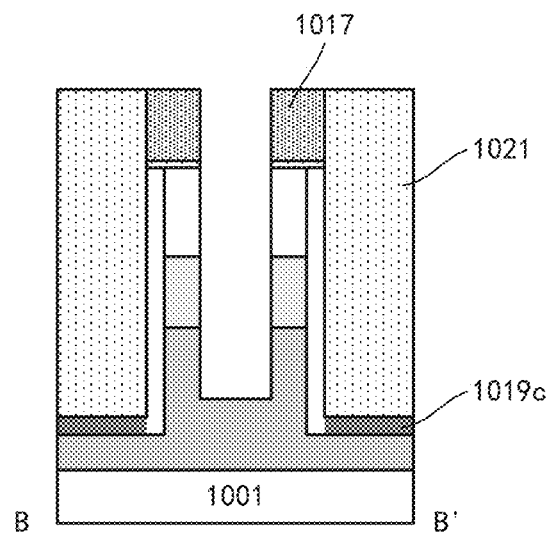

As shown in FIGS. 9(a) and 9(b), the spacer 1017 may be used as an etching mask, for example, by RIE, the etching stop layer 1009, the third material layer 1005, and the second material layer 1003 and the upper part of the substrate 1001 may be selectively etched in sequence. The etching may be performed into the well region of the substrate 1001. In this way, in the space surrounded by the isolation portions 1007 and 1021, the third material layer 1005, the second material layer 1003 and the upper part of the substrate 1001 form a pair of stacks with strip patterns corresponding to the spacer 1017 to define the active area.

Of course, the formation of the strip-shaped stack for defining the active area is not limited to the spacer pattern transfer technology, and may also be performed by photolithography using photoresist or the like.

Here, for the purpose of epitaxial growth, the second material layer 1003 used to define the gate stack position includes a semiconductor material, which is inconvenient in the following processing of the source/drain portion. For this reason, the second material layer 1003 may be replaced with a dielectric material to form a dummy gate to facilitate subsequent processing of the source/drains portion.

Figure 10:
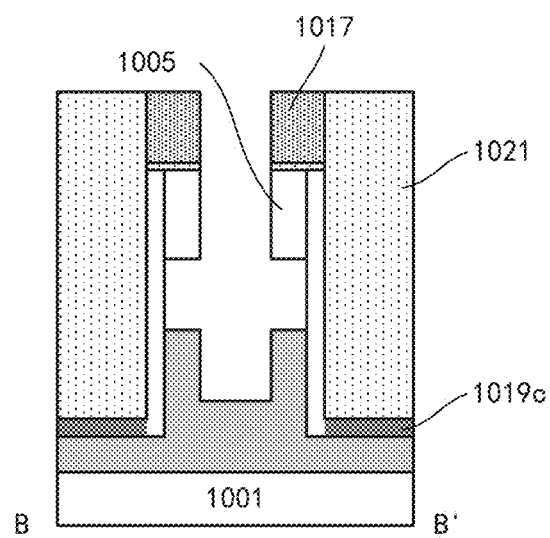
Figure 11:
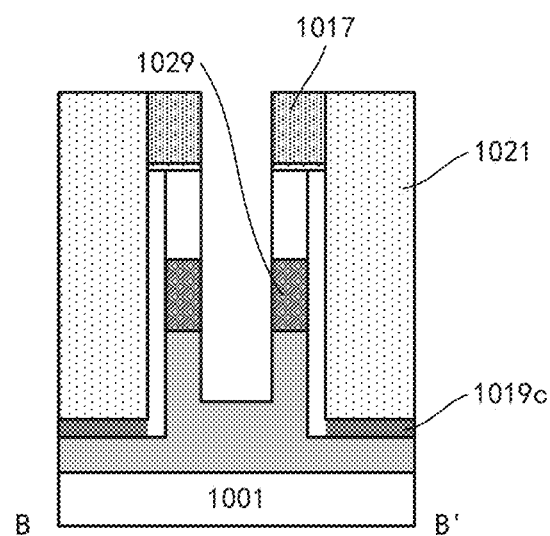

For example, as shown in FIG. 10, with respect to the first active layer 1019, the substrate 1001, and the third material layer 1005 (in this example, all of them are Si), the second material layer 1003 (SiGe in this example) may be removed by selective etching. Then, as shown in FIG. 11, a dummy gate 1029 may be formed in the space left under the spacer 1017 due to the removal of the second material layer 1003. The dummy gate 1029 may be formed by deposition and then etching back. For example, the dummy gate 1029 may include a material having etching selectivity with respect to the first material layer, the third material layer, and the first active layer, such as SiC.

Figure 12A:
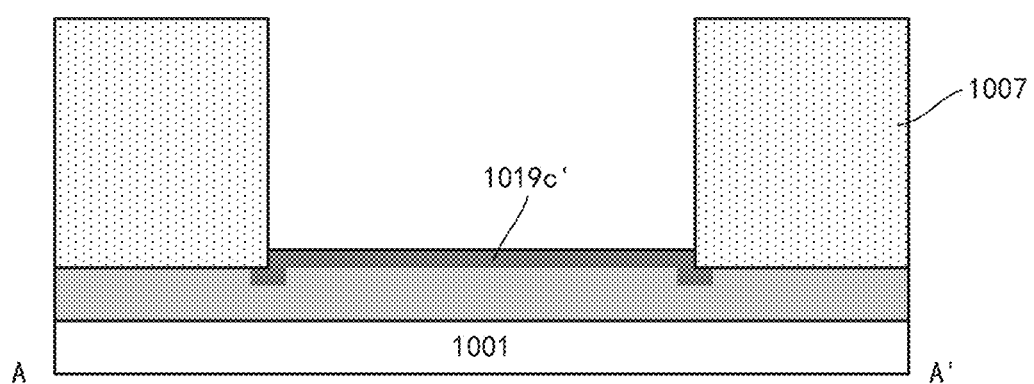
Figure 12B:
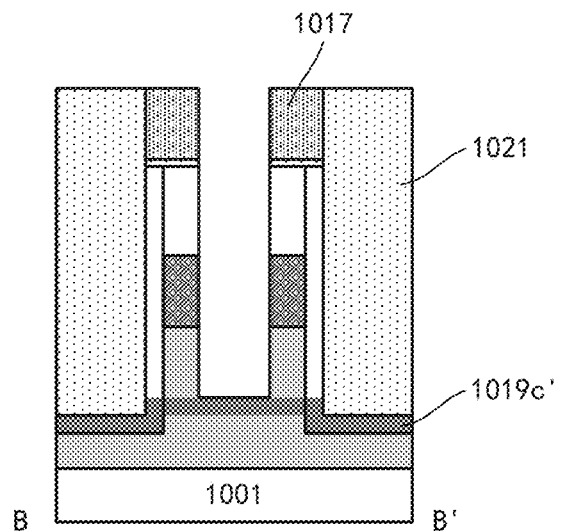

According to the embodiment, the contact area 1019c may be thickened to reduce the contact resistance from the subsequently formed contact portion to the lower end source/drain portion. For example, as shown in FIGS. 12(a) and 12(b), dopants may be implanted into the substrate 1001 on the inner side of the spacer 1017 by ion implantation. The conductivity type of the dopant may be the same as the conductivity type of the lower end contact portion formed later. For example, for p-type devices, p-type dopants such as B, $BF_2$ or In may be implanted with a concentration of about 1E19-1E21 $cm^{-3}$; for n-type devices, n-type dopants such as P or As may be implanted with a concentration of approximately 1E19-1E21 $cm^{-3}$. In the substrate 1001 on the inner and outer sides of the spacer 1017, the dopants implanted twice in succession may be connected to each other by annealing, and they are shown together as 1019c' in the drawing.

In this example, due to this ion implantation, the respective lower source/drain portions of the two opposing devices may be connected to each other. However, the present disclosure is not limited to this. For example, when isolation is required between the lower source/drain portions of two devices, a dielectric material may be deposited in the lower part of the space on the inner side of the spacer 1017 and then etched back to form the isolation portion.

After that, the source/drain portions may be formed.

Figure 13A:
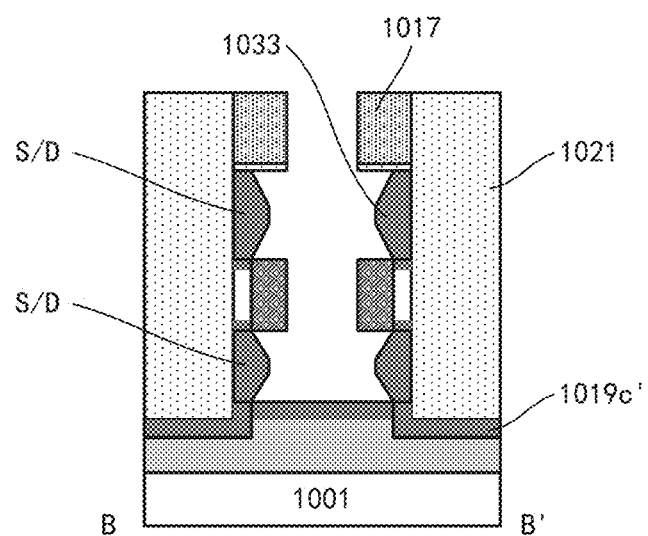

For example, as shown in FIG. 13(a), the first material layer and the third material layer may be at least partially etched back by selective etching. Etching back may be carried out into the first active layer, but it is preferable to leave the semiconductor layer (the first material layer, the third material layer, or the first active layer) with a certain thickness on the upper and lower sides of the dummy gate to serve as the seed layer for subsequent epitaxial growth. After that, the second active layer 1033 may be formed on the upper and lower sides of the dummy gate by selective epitaxial growth. The second active layer 1033 may be doped in-situ during growth. In addition, annealing treatment may be performed to activate the dopants to form the source/drain portions S/D. In the source/drain portion S/D, the concentration of the dopants may be about 1E19-1E21 $cm^{-3}$.

According to the embodiment, the dopants may also be driven into the first active layer 1019, and preferably into the end of the portion (defining the channel portion) of the first active layer 1019 covered by the dummy gate 1023. Therefore, the doping profile of the source/drain portion may have some overlap with the dummy gate 1023 (and the gate stack formed later), which helps to reduce the external resistance.

In this example, the dummy gate may be used as a mask when the first material layer and the third material layer are etched back. Therefore, the etch back may be performed along the upper and lower surfaces of the dummy gate, and the second active layer 1033 may grow along the upper and lower surfaces of the dummy gate. Therefore, the extent to which the dopants in the second active layer 1033 are driven into the first active layer (more specifically, the portion of the first active layer covered by the dummy gate) may be substantially the same at the upper and lower surfaces of the dummy gate. More specifically, the distance between the doped interface between the source/drain portion S/D at the upper end and the channel portion and the upper surface of the dummy gate may be substantially equal to the distance between the doped interface between the source/drain portion S/D at the lower end and the channel portion and the bottom surface of the dummy gate. The distance may be about 2 nm-10 nm, for example. In addition, the distance may be kept substantially constant along the longitudinal extension direction (the first direction) of the dummy gate.

Herein, the material of the second active layer 1033 may be selected, for example, a semiconductor material having a different lattice constant from the first active layer, so as to apply stress to the channel area subsequently formed in the first active layer to enhance device performance. For example, for p-type devices, the second active layer 1033 may include SiGe (the atomic percentage of Ge is, for example, about 0-75%). When the atomic percentage of Ge is greater than 0, compressive stress may be applied to the channel portion. For n-type devices, the second active layer 1033 may include SiC (the atomic percentage of C is, for example, about 0-3%). When the atomic percentage of C is greater than 0, tensile stress may be applied to the channel portion.

In addition, the grown second active layer 1033 may have a shape that tapers toward the inner side in the cross-sectional view, for example, a substantially trapezoidal shape. This helps reduce the capacitance between the source/drain portion and the gate stack.

In this example, the source/drain portions S/D are formed by a second active layer that is additionally epitaxially grown. However, the present disclosure is not limited to this. For example, the source/drain portions S/D may be formed directly based on the first material layer and the third material layer.

Figure 13B:
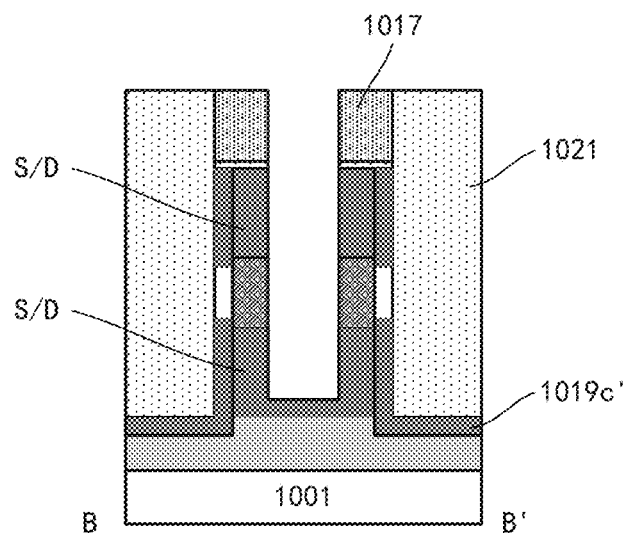

As shown in FIG. 13(b), a solid-phase dopant source layer (not shown) may be formed on the structure shown in FIGS. 12(a) and 12(b) by, for example, deposition. For example, the solid-phase dopant source layer may be an oxide containing dopants. The dopants contained in the solid-phase dopant source layer may be used to dope the source/drain portion (and optionally, an exposed surface of the substrate 1001, especially when ion implantation is not performed on the exposed surface), so it may have the same conductivity type as the source/drain portion to be formed. For example, for a p-type device, the solid-phase dopant source layer may include a p-type dopant such as B or In; for an n-type device, the solid-phase dopant source layer may include an n-type dopant such as P or As. The concentration of the dopants of the solid phase dopant source layer may be about 0.01%-5%. The dopants in the solid-phase dopant source layer may be driven into the first material layer and the third material layer to form the source/drain portion S/D (and optionally, may be driven into the exposed surface of the substrate 1001 to form a connection area connecting the source/drain portions S/D at the lower ends of the two devices). Likewise, dopants may be driven into the first active layer, so that the doping profile of the source/drain portion S/D may have some overlap with the dummy gate 1023 (and the gate stack formed later). After that, the solid-phase dopant source layer may be removed.

In this example, the first material layer is provided through the upper portion of the substrate 1001. However, the present disclosure is not limited to this. For example, the first material layer may also be an epitaxial layer on the substrate 1001. In this case, the first material layer and the third material layer may be doped in-situ during epitaxial growth, instead of using a solid-phase dopant source layer for doping.

In the following description, in order to simplify the illustration of the cross-sectional view, the situation shown in FIG. 13(b) is taken as an example, but the following description is also applicable to the example shown in FIG. 13(a).

Next, a gate replacement process may be performed to replace the dummy gate with a gate stack.

Figure 14A:
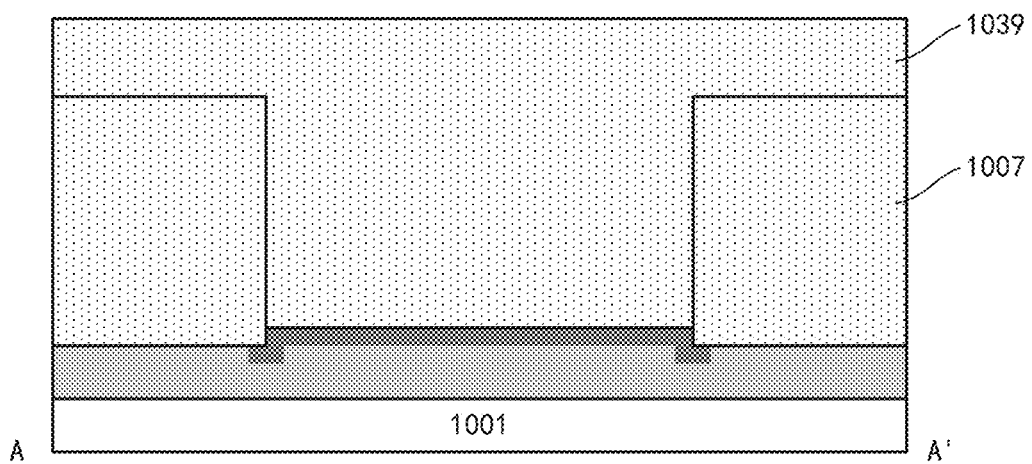
Figure 14B:
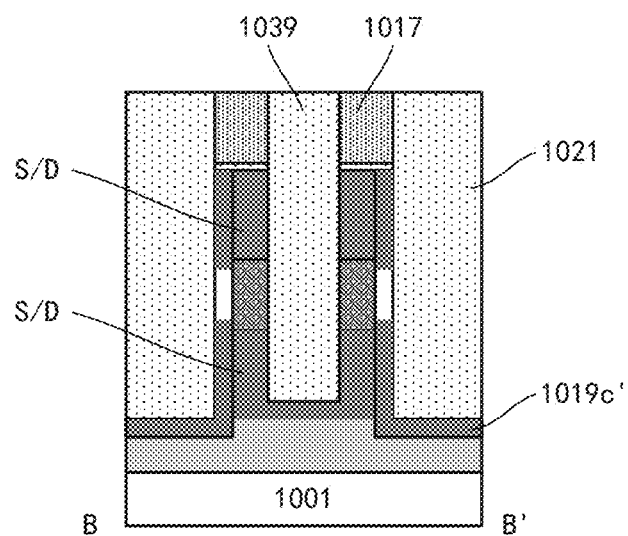

As shown in FIGS. 14(a) and 14(b), an isolation layer 1039 may be formed on the inner side of the spacer 1017. For example, a dielectric material such as oxide may be deposited to completely fill the space on the inner side of the spacer 1017. Then, the deposited dielectric material may be planarized, such as CMP, and the CMP may be stopped at the spacer 1017 to form an isolation layer 1039.

Herein, the gate stack is subsequently formed in a relatively small space on the inner side of the spacer 1017. In order to facilitate the production of the contact portion to the gate stack, the space on the inner side of the spacer 1017 may be increased. For example, the space on the inner side of the spacer 1017 on the isolation layer 1007 may be increased, and the spacer 1017 on the active area may be kept almost stationary to protect the active area. Subsequently, the landing pad of the gate contact portion may be formed in such an enlarged space.

Figure 15A:
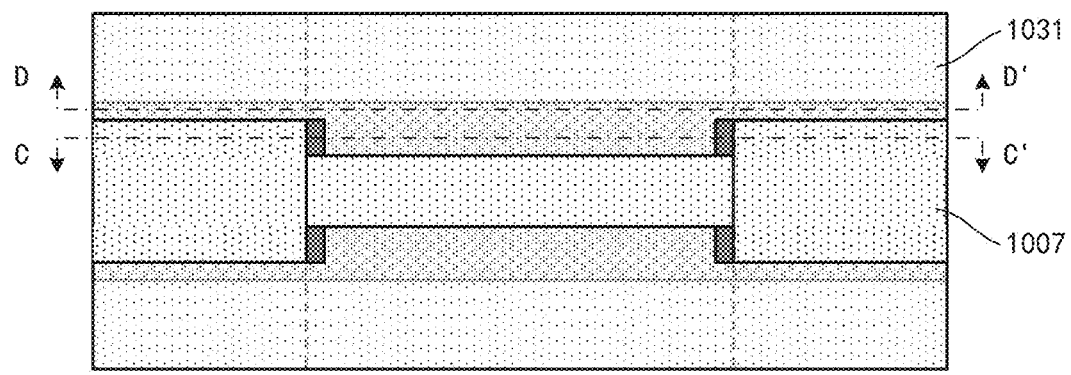
Figure 15B:
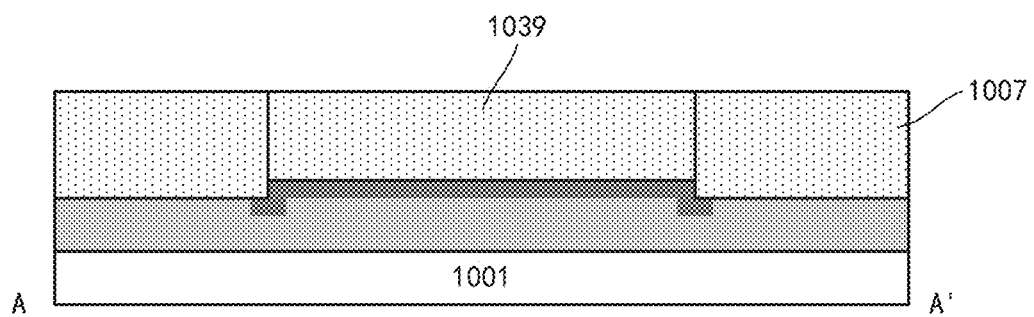
Figure 15C:
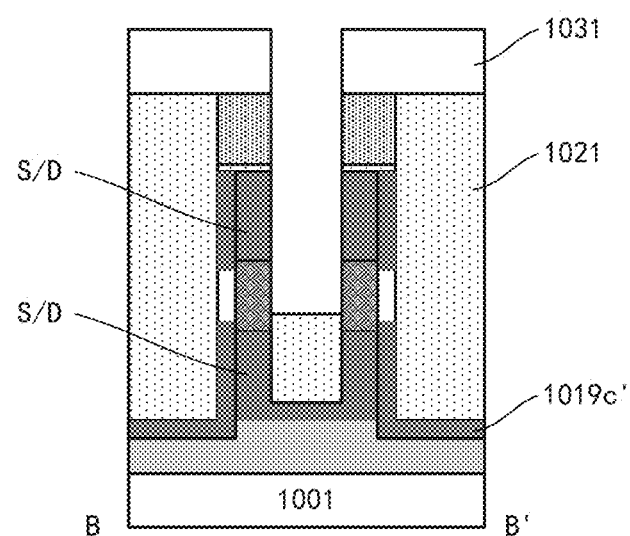
Figure 15D:
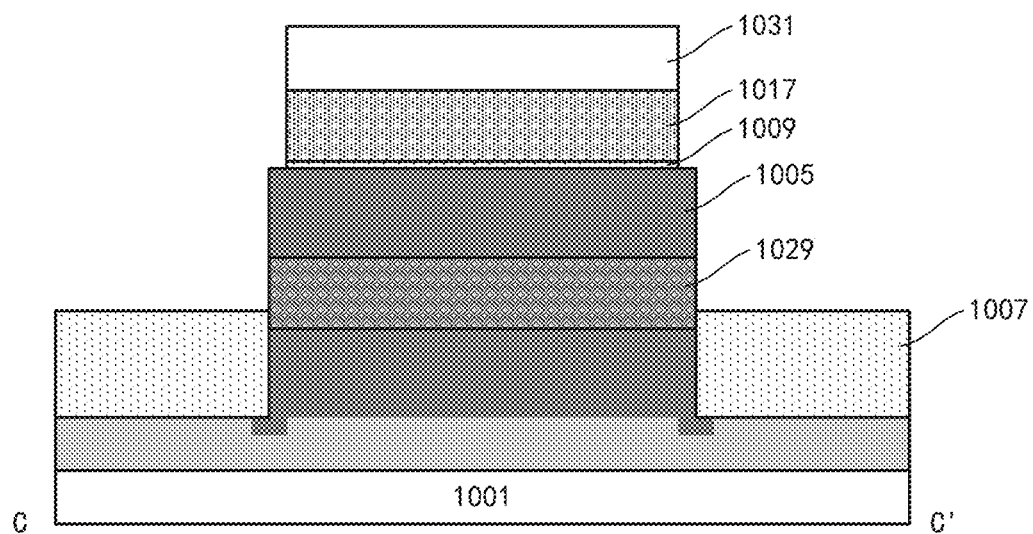
Figure 15E:
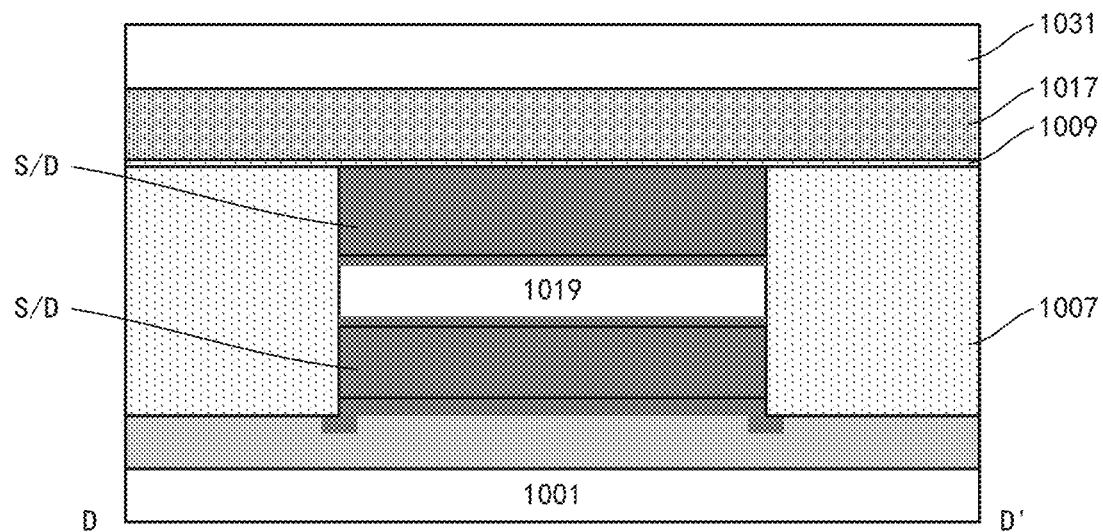
FIG. 15(e) is a cross-sectional view taken along DD' line.

As shown in FIGS. 15(a) to 15(e), a photoresist 1031 may be formed, and the photoresist 1031 may be patterned to expose a large area on opposite sides (the left and right sides in FIG. 15(a)) of the stripe-shaped active area in the first direction, especially to expose the inner part of the spacer 1017 on the isolation layer 1007, and to expose the space on the inner side of the spacer 1017 on the strip-shaped active area. In addition, at opposite ends of the strip-shaped active area in the first direction, a part of the spacer 1017 may be exposed, so that the gate stack may extend from here to the isolation layer 1007 on both sides. Note that the gate stack may also extend from between the spacers 1017 on the active area to the isolation layers 1007 on both sides, but the additional extension from the above opposite ends may reduce resistance.

Herein, the space exposed by the photoresist 1031 may not exceed the spacer 1017 (that is, the spacer 1017 on the isolation layer 1007 will not be completely removed, but a part of its outer side may be left), so that the subsequently formed gate stack may be left on the inner side of the spacer 1017.

The photoresist 1031 may be used as a mask to selectively etch the spacer 1017, such as RIE. In this way, as shown in the top view of FIG. 15(a), the space on the inner side of the spacer 1017 increases on opposite sides in the first direction. In addition, as shown in the cross-sectional view of FIG. 15(d), at both ends of the active area, part of the sidewalls of the dummy gate 1029 are exposed, which will cause the gate stack to extend onto the isolation layer 1007 on both sides in the subsequent gate replacement process.

The isolation layers 1007, 1039 on the inner side of the spacer 1017 may be etched back, such as RIE, leaving the isolation layers 1007, 1039 with a certain thickness at the bottom of the space on the inner side of the spacer 1017. The isolation layers 1007 and 1039 may shield the source/drain portions at the lower end, for example, the top surface thereof is (slightly) higher than the bottom surface of the dummy gate, however the sidewall of the dummy gate is fully exposed for subsequent removal of the dummy gate and filling of the gate stack. After that, the photoresist 1031 may be removed.

Figure 16A:
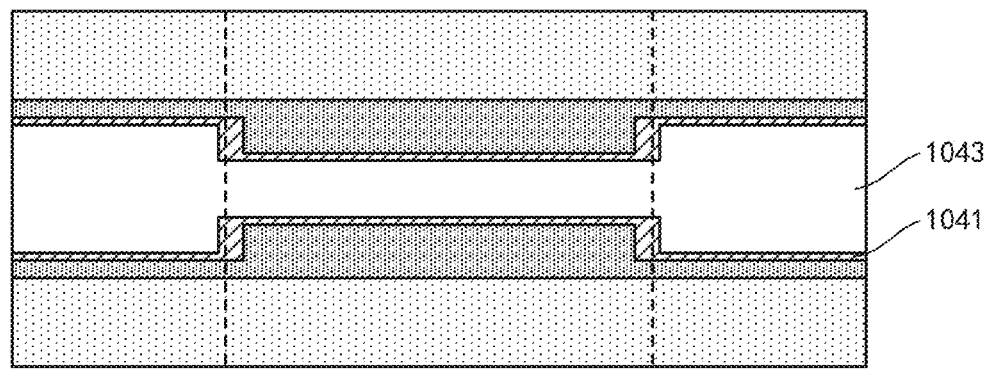
Figure 16B:
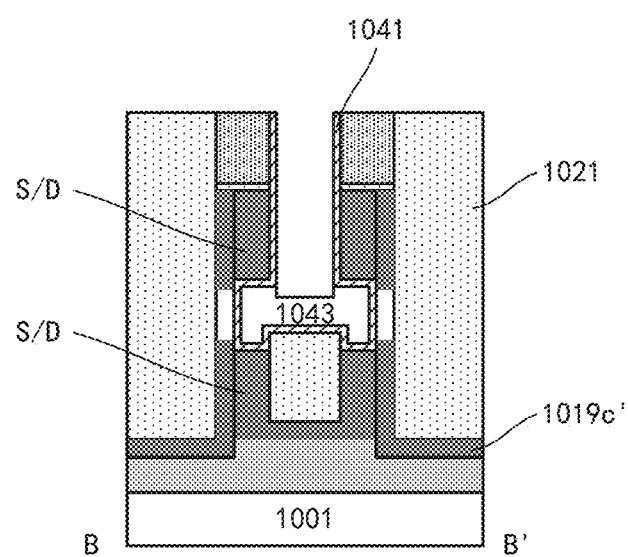
Figure 16C:
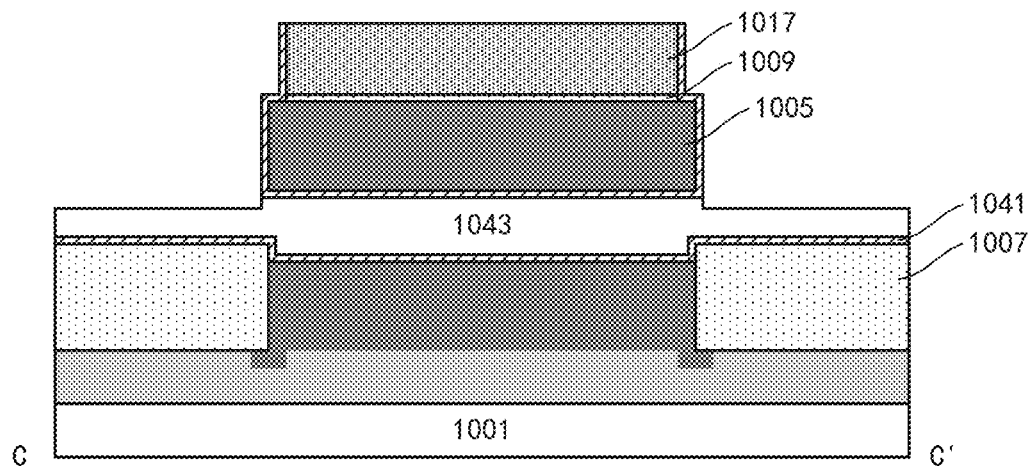

Then, as shown in FIGS. 16(a) to 16(c), the dummy gate may be removed by selective etching, and the gate stack may be formed on the inner side of the spacer 1017. For example, the gate dielectric layer 1041 may be formed in a substantially conformal manner by deposition, and the gate conductor layer 1043 may be filled in the remaining space. The filled gate conductor layer 1043 may be planarized, such as CMP, and the CMP may stop at the spacer 1017. Then, the gate conductor layer 1043 may be etched back to make its top surface lower than the top surface of the original dummy gate to reduce the capacitance between the source/drain portion and the gate stack. In this way, the end portion of the formed gate stack is embedded in the space where the previous dummy gate is located, and overlaps with the first active layer, thereby defining the channel portion in the first active layer. In addition, in the plan view, the gate stack may cover almost the entire space on the inner side of the spacer 1017 on the isolation layer 1007, 1039.

For example, the gate dielectric layer 1041 may include a high-k gate dielectric such as $HfO_2$, and the thickness is, for example, about 1 nm-5 nm. Before forming the high-k gate dielectric, an interface layer may also be formed, for example, an oxide formed by an oxidation process or deposition such as atomic layer deposition (ALD), with a thickness of about 0.3 nm-1.5 nm. The gate conductor layer 1043 may include work function adjusting metals such as TiN, TaN, TiAlC, etc., and gate conductive metals such as W.

According to the device design, the gate conductor layer 1043 may be disconnected between the two devices by, for example, photolithography, and the landing pad of the gate contact portion may also be patterned.

Figure 17:
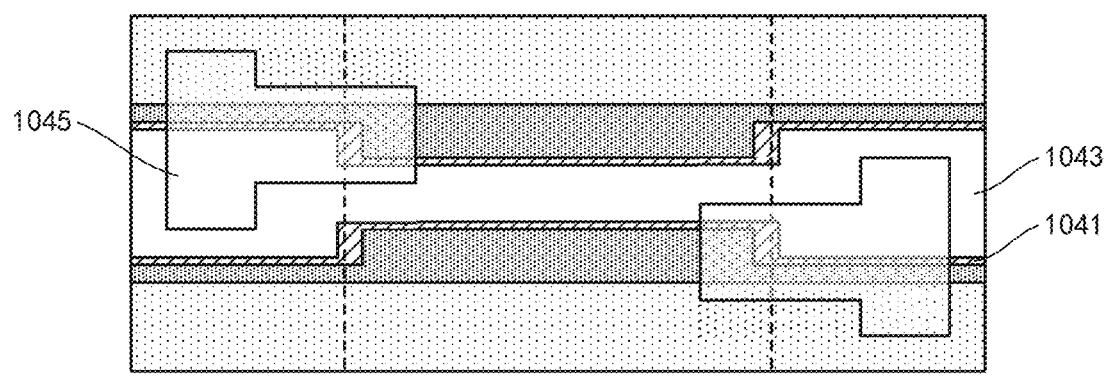
Figure 18A:
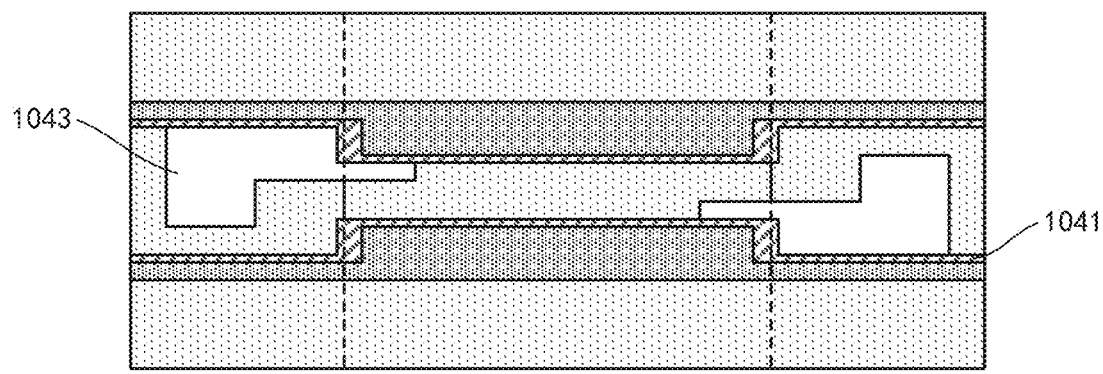
Figure 18B:
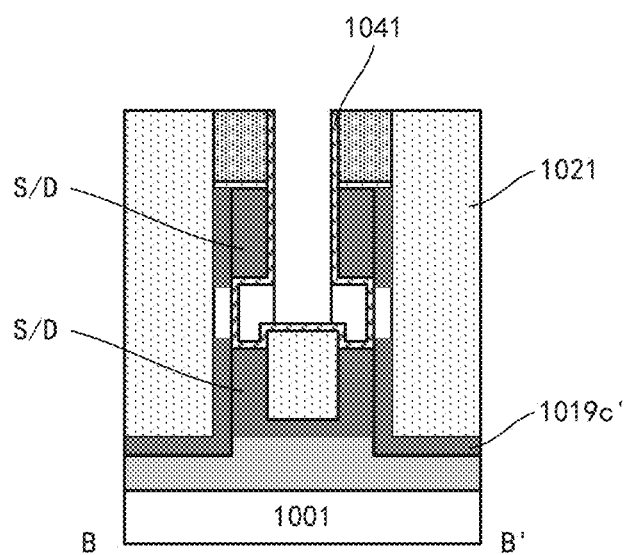
Figure 18C:
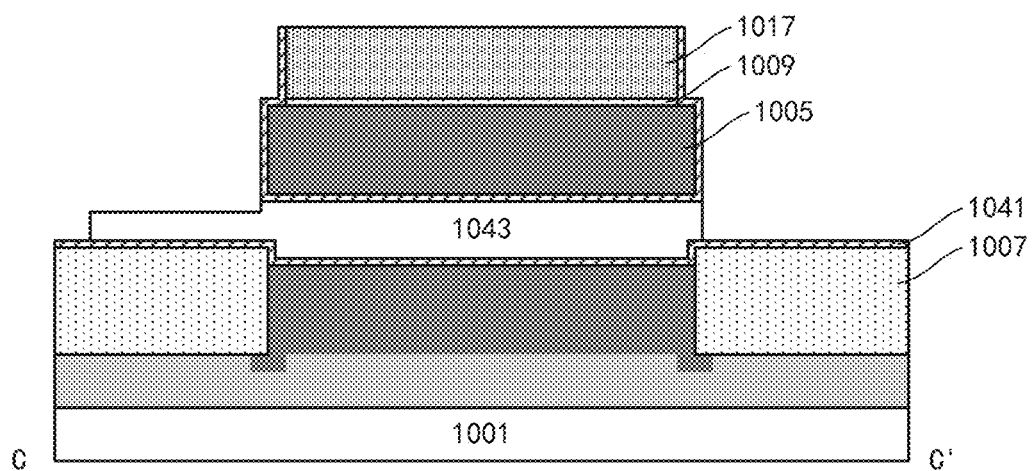

As shown in FIG. 17, a photoresist 1045 may be formed and patterned to cover the area where the landing pad of the gate contact portion is to be formed, while exposing other areas. Then, as shown in FIGS. 18(a) to 18(c), the photoresist 1045 (and the spacer 1017) may be used as a mask to selectively etch the gate conductor layer 1043, such as RIE. The RIE may stop at the gate dielectric layer 1041.

As shown in FIG. 18(a), the gate conductor layer 1043 is separated between the two opposing devices respectively located under the opposing spacer 1017, so as to combine with the gate dielectric layer 1041 to define gate stacks respectively used for two devices. In addition, the gate conductor layer extends from the end portion of the active area onto the isolation layer 1007, and has an enlarged area, thereby forming the landing pad. The landing pads of the two devices are located on different sides of the active area (on the left and right sides in FIG. 18(a)) to avoid mutual influence.

So far, the basic structure of the device is completed. Subsequently, various contact portions, interconnecting structures, etc. may be made.

Figure 19A:
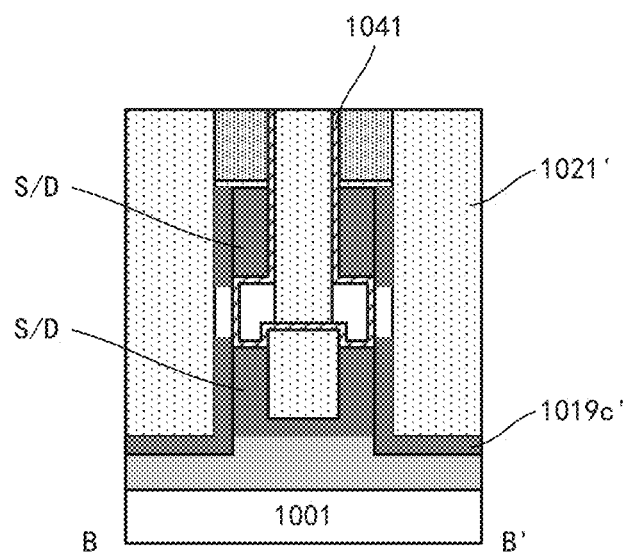
Figure 19B:
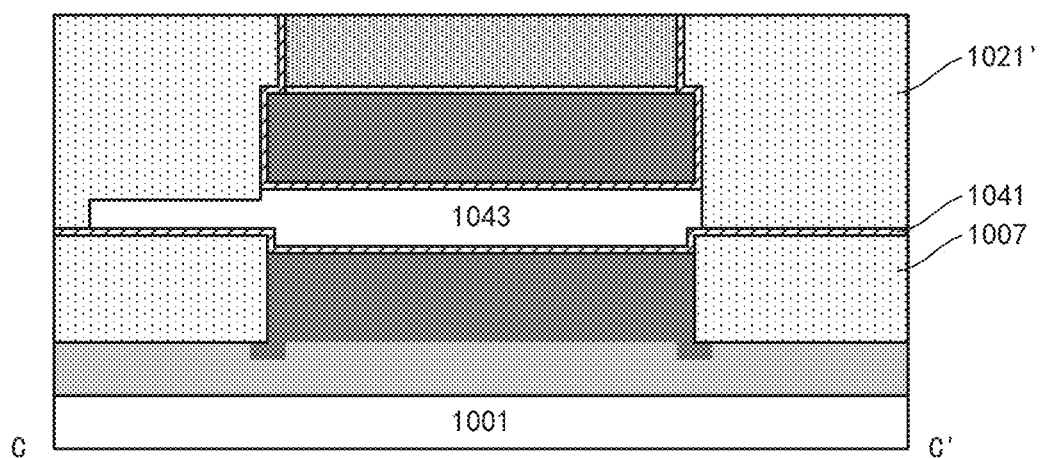

For example, as shown in FIGS. 19(a) and 19(b), the space on the inner side of the spacer 1017 may be filled with a dielectric material such as oxide (shown as 1021' together with the previous isolation layer) by, for example, deposition and then planarization.

Figure 20A:
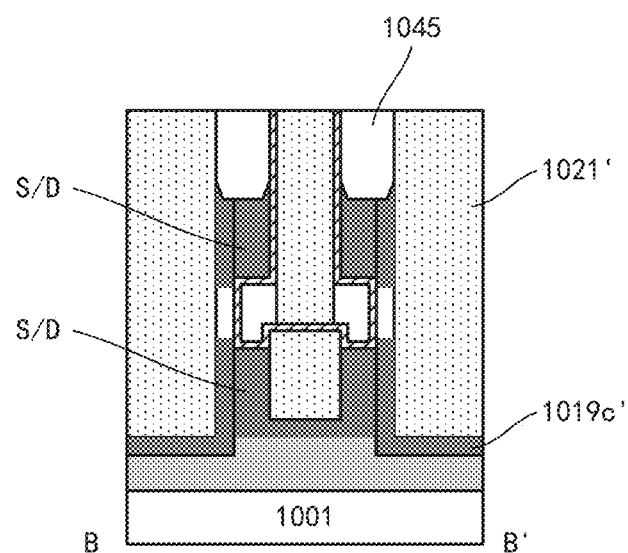
Figure 20B:
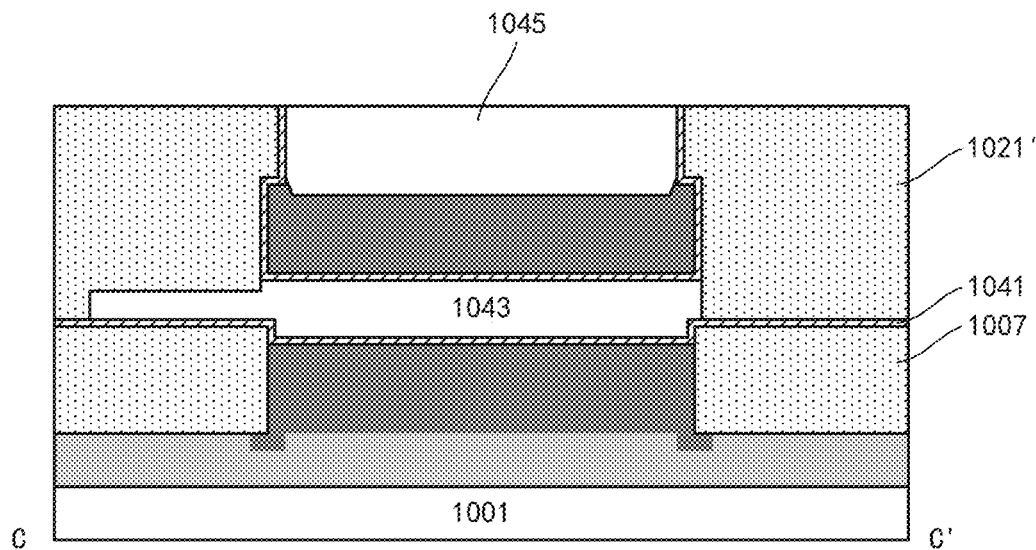

Herein, the contact portion to the source/drain portion S/D at the upper end may be formed in a self-aligned manner. For example, as shown in FIGS. 20(a) and 20(b), photoresist (not shown) may be used to shield the spacer 1017 on both sides of the active area, and the exposed spacer 1017 may be selectively etched such as RIE to at least partially expose the source/drain portion S/D at the upper end. Then, a conductive material such as metal may be filled in the space formed by the removal of the spacer 1017 to form a contact portion 1045 with the source/drain portion S/D of the upper end.

Figure 21A:
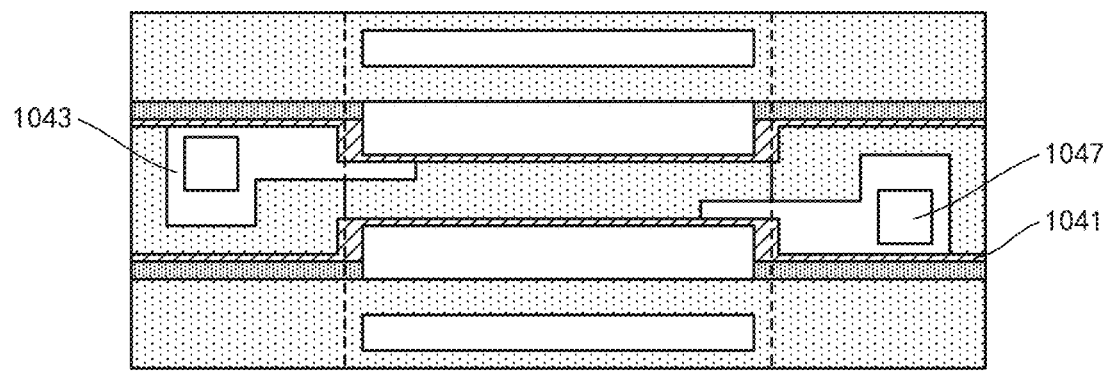
Figure 21B:
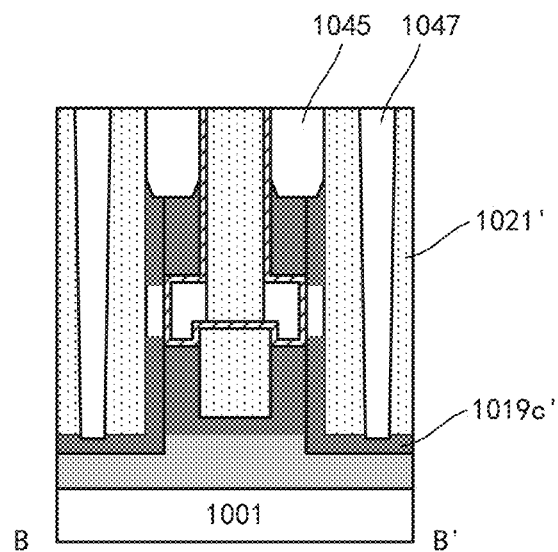
Figure 21C:
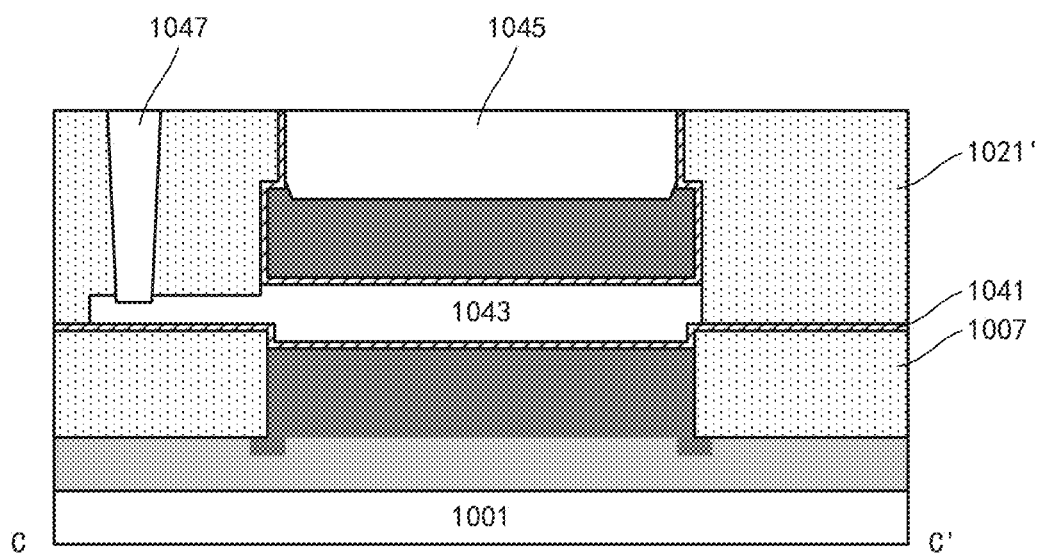

Then, as shown in FIGS. 21(a) to 21(c), a contact hole may be formed in the isolation layer 1021', and a conductive material such as metal may be filled in the contact hole to form a contact portion 1047. The contact portion 1045 may include a contact portion with the lower end source/drain portion of each device and a contact portion with the gate conductor.

The semiconductor device according to the embodiments of the present disclosure may be applied to various electronic devices. For example, it is possible to form an integrated circuit (IC) based on such a semiconductor device, thereby constructing an electronic device. Therefore, the present disclosure also provides an electronic device including the above-mentioned semiconductor device. The electronic device may also include components such as a display screen matched with an integrated circuit and a wireless transceiver matched with an integrated circuit. Such an electronic device are for example, a smart phone, a computer, a tablet computer (PC), a wearable smart device, a mobile power supply, etc.

According to some embodiments of the present disclosure, a manufacturing method of a system on chip (SoC) is also provided. The method may include the method described above. Specifically, a variety of devices may be integrated on the chip, at least some of which are manufactured according to the method of the present disclosure.

In the above description, the technical details such as patterning and etching of each layer are not described in detail. However, those skilled in the art should understand that various technical means may be used to form layers, areas, etc. of desired shapes. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device comprising:
    a channel portion extending vertically on a substrate;
    source/drain portions located at upper and lower ends of the channel portion relative to the substrate and along the channel portion, wherein the source/drain portions extend toward a side of the channel portion in a lateral direction relative to the substrate, so that the source/drain portions and the channel portion constitute a C-shaped structure; and a gate stack that overlaps the channel portion on an inner sidewall of the C-shaped structure, wherein the gate stack comprises a portion surrounded by the C-shaped structure, and wherein in the lateral direction, the gate stack is located on a side of the channel portion facing an opening of the C-shaped structure.

2. The semiconductor device according to claim 1, wherein a distance between an upper surface of the portion of the gate stack and a doped interface between the source/drain portion at the upper end and the channel portion is substantially equal to a distance between a lower surface of the portion of the gate stack and a doped interface between the source/drain portion at the lower end and the channel portion.

3. The semiconductor device according to claim 2, wherein the distances are in a range of 2 nm-10 nm.

4. The semiconductor device according to claim 1, wherein the doping profile of the source/drain portion has an end portion that overlaps the gate stack.

5. The semiconductor device according to claim 1, wherein the channel portion and the source/drain portions at the upper and lower ends of the channel portion extend in a first direction on the substrate, and are interposed in an isolation layer in the first direction.

6. The semiconductor device according to claim 5, wherein, in the first direction, a gate conductor in the gate stack comprises a first portion surrounded by the C-shaped structure and a second portion extending laterally from the first portion into the isolation layer.

7. The semiconductor device according to claim 6, wherein the second portion is enlarged relative to the first portion.

8. The semiconductor device according to claim 1, wherein the source/drain portion has a shape that is tapered toward an inner side of the C-shaped structure in a cross-sectional view.

9. The semiconductor device according to claim 1, wherein the channel portion is formed in a first semiconductor layer, and the first semiconductor layer extends vertically to the source/drain portions so that end portions at upper and lower ends of the first semiconductor layer respectively constitute a portion of a corresponding source/drain portion, the source/drain portions further comprise a second semiconductor layer and a third semiconductor layer on the upper and lower ends of the first semiconductor layer.

10. The semiconductor device according to claim 9, wherein the second semiconductor layer and the third semiconductor layer comprise a different material from the first semiconductor layer.

11. The semiconductor device according to claim 9, wherein the third semiconductor layer is a part of the substrate.

12. The semiconductor device according to claim 9, wherein the first semiconductor layer comprises a first portion constituting at least a part of the outer sidewall of the C-shaped structure, and a second portion extending laterally from the first portion in a direction away from the outer sidewall of the C-shaped structure.

13. The semiconductor device according to claim 1, wherein the outer sidewall of the C-shaped structure is substantially flat.

14. The semiconductor device according to claim 1, wherein the channel portion and the source/drain portions comprise a single crystal semiconductor material.

15. The semiconductor device according to claim 1, further comprising: a contact portion on the source/drain portion at the upper end, wherein the contact portion comprises a sidewall that is substantially coplanar with the outer sidewall of the C-shaped structure.

16. The semiconductor device according to claim 1, wherein there are a plurality of the semiconductor devices on the substrate, wherein the C-shaped structures of at least a pair of semiconductor devices are opposite to each other.

17. The semiconductor device according to claim 16, wherein the respective upper source/drain portions of the pair of semiconductor devices are substantially coplanar, the respective gate stacks are substantially coplanar, and the respective lower source/drain portions are substantially coplanar.

18. The semiconductor device according to claim 16, wherein a gate conductor in the gate stack in a first semiconductor device of the pair of semiconductor devices comprises a first portion surrounded by a corresponding C-shaped structure, and a second portion extending laterally from the first portion in a first direction parallel to a longitudinal extension direction of the channel portion, a gate conductor in the gate stack in a second semiconductor device of the pair of semiconductor devices comprises a third portion surrounded by a corresponding C-shaped structure and a fourth portion extending laterally from the third portion in a second direction parallel to the longitudinal extension direction of the channel portion and opposite to the first direction.

19. An electronic device, comprising the semiconductor device according to claim 1.

20. The electronic device according to claim 19, comprising at least one of smart phones, computers, tablets, wearable smart devices, artificial intelligence devices, and mobile power supplies.

21. A method of manufacturing a semiconductor device, comprising:
providing a stack of a first material layer, a second material layer and a third material layer on a substrate;
patterning the stack into a strip shape extending in a first direction;
forming a first active layer on a sidewall of the stack patterned into the strip shape;
forming a strip-shaped opening extending in the first direction in the stack patterned into the strip shape, thereby dividing the stack into two parts on opposite sides of the opening;
replacing the second material layer with a dummy gate through the opening;
forming source/drain portions in the first material layer and the third material layer;
removing the dummy gate through the opening; and
forming a gate stack, the gate stack comprising a portion embedded in a space left due to the removal of the dummy gate,
wherein the gate stack is located between the first active layer and the opening.

22. The method according to claim 21, wherein the first material layer is an upper portion of the substrate or an epitaxial layer on the substrate.

23. The method according to claim 21, wherein the second material layer has an etching selectivity relative to the first material layer and the third material layer.

24. The method according to claim 21, wherein patterning the stack into a strip shape comprises:
   forming a strip-shaped mandrel layer extending in the first direction on the third material layer;
   forming a spacer on opposite sides of the mandrel layer; and
   using the mandrel layer and the spacer as a mask to etch the stack.

25. The method according to claim 24, wherein forming the first active layer comprises:
   etching back the stack so that a side wall of the stack is relatively recessed with respect to a side wall of the spacer; and
   forming a first active layer on the sidewall of the stack through epitaxial growth.

26. The method according to claim 25, wherein the first active layer comprises a portion extending laterally on the substrate, and the method further comprises:
   forming a contact area in the laterally extending portion.

27. The method according to claim 24, further comprising:
   forming an isolation layer on the substrate; and
   planarizing the isolation layer to expose the mandrel layer.

28. The method according to claim 27, wherein forming the opening comprises:
   removing the mandrel layer; and
   using the spacer as a mask to etch the stack.

29. The method according to claim 21, wherein forming the source/drain portions comprises:
   forming a dopant source layer in the opening; and
   driving dopant in the dopant source layer into the first material layer, the third material layer and the upper and lower ends of the first active layer.

30. The method according to claim 21, wherein forming the source/drain portions comprises:
   at least partially removing the first material layer and the third material layer; and
   growing a second active layer on upper and lower sides of the dummy gate.

31. The method according to claim 30, further comprising:
   doping the second active layer in situ during growing the second active layer; and
   driving dopant in the second active layer into the upper and lower ends of the first active layer.

32. The method according to claim 21, further comprising:
   forming isolation portions extending in a second direction intersecting the first direction on opposite sides of the stack in the first direction, the stack being interposed between the isolation portions.

33. The method according to claim 32, wherein the strip-shaped mandrel layer extends onto the isolation portions,
   removing the dummy gate comprises:
      filling the opening with dielectric material;
      removing a part of the spacer located on the isolation portions near the opening;
      etching back the isolation portions and the dielectric material exposed on an inner side of the spacer to expose a part of a sidewall of the dummy gate, so as to remove the dummy gate.

34. The method according to claim 33, wherein forming the gate stack comprises:
   forming a gate dielectric layer in a substantially conformal manner in a space on the inner side of the spacer;
   filling the remaining space on the inner side of the spacer with a gate conductor layer;
   forming a shielding layer on the gate conductor layer to respectively shield a part of the gate conductor layer on the isolation portions on the opposite sides; and
   using the shielding layer and the spacer as a mask to pattern the gate conductor layer to divide it into two parts.

* * * * *